US008872308B2

(12) United States Patent
Arkun et al.

(10) Patent No.: US 8,872,308 B2
(45) Date of Patent: *Oct. 28, 2014

(54) ALN CAP GROWN ON GAN/REO/SILICON SUBSTRATE STRUCTURE

(71) Applicants: Erdem Arkun, San Carlos, CA (US); Michael Lebby, Apache Junction, AZ (US); Andrew Clark, Los Altos, CA (US); Rytis Dargis, Fremont, CA (US)

(72) Inventors: Erdem Arkun, San Carlos, CA (US); Michael Lebby, Apache Junction, AZ (US); Andrew Clark, Los Altos, CA (US); Rytis Dargis, Fremont, CA (US)

(73) Assignee: Translucent, Inc., Palo Alto, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 13/772,169

(22) Filed: Feb. 20, 2013

(65) Prior Publication Data

US 2014/0231818 A1      Aug. 21, 2014

(51) Int. Cl.
*H01L 29/20* (2006.01)
*H01L 21/02* (2006.01)

(52) U.S. Cl.
CPC ........ *H01L 21/0254* (2013.01); *H01L 29/2003* (2013.01)
USPC ................. 257/615; 257/11; 257/22; 257/76; 257/79; 257/89; 257/189; 257/190; 257/E21.09; 257/E21.097; 257/E21.117; 257/E21.127; 257/E21.157; 257/E21.386; 257/E29.294; 257/E33.025; 257/E33.048; 438/478; 438/493; 438/604

(58) Field of Classification Search
USPC ................. 257/11, 22, 76, 89, 189, 190, 615, 257/E21.09, E21.097, E21.117, E21.127, 257/E21.157, E21.386, E29.249, E33.025, 257/E33.049; 438/478, 493, 604
See application file for complete search history.

(56) References Cited

U.S. PATENT DOCUMENTS 8,633,569 B1 * 1/2014 Arkun et al. .................. 257/615

OTHER PUBLICATIONS

Lee et al., "GaN on Si with nm—thick single—crystal Sc2O3 as a template using molecular beam epitaxy"' Journal of Crystal Growth, 311 (2009) 2006-2009.*
Raghavan and Redwing, "Group III—A nitrides on Si: stress and microstructural evolution" Book Title: III-V compound Semiconductors, pp. 209-256, CRC Press, Boca Raton, Fla. (2011).*

* cited by examiner

*Primary Examiner* — Asok K Sarkar
(74) *Attorney, Agent, or Firm* — Parson & Goltry; Robert A. Parsons; Michael W. Goltry

(57) ABSTRACT

III-N material grown on a silicon substrate includes a single crystal rare earth oxide layer positioned on a silicon substrate. The rare earth oxide is substantially crystal lattice matched to the surface of the silicon substrate. A first layer of III-N material is positioned on the surface of the rare earth oxide layer. An inter-layer of aluminum nitride (AlN) is positioned on the surface of the first layer of III-N material and an additional layer of III-N material is positioned on the surface of the inter-layer of aluminum nitride. The inter-layer of aluminum nitride and the additional layer of III-N material are repeated n-times to reduce or engineer strain in a final III-N layer. A cap layer of AlN is grown on the final III-N layer and a III-N layer of material with one of an LED structure and an HEMT structure is grown on the AlN cap layer.

15 Claims, 1 Drawing Sheet

US 8,872,308 B2

ALN CAP GROWN ON GAN/REO/SILICON SUBSTRATE STRUCTURE

FIELD OF THE INVENTION

This invention relates in general to the growth of III-N material on a silicon substrate and more specifically to the incorporation of an aluminum nitride cap on a GaN/REO/silicon substrate structure.

BACKGROUND OF THE INVENTION

In the semiconductor industry, it is known that growing a III-N material, such as GaN, on a silicon substrate is difficult due in large part to the large crystal lattice mismatch (−16.9%) and the thermal mismatch (53%) between silicon and GaN. Thus, some type of buffer layer or layers is generally formed on the silicon substrate and the III-N material is grown on the buffer layer. Generally, the prior art buffer layers are either complicated and expensive to form or do no adequately reduce the strain in the GaN due to crystal lattice mismatch.

It is also known that during much of the growth process there must ideally be no exposed silicon surface due to detrimental reaction between silicon and the various MBE process gasses, i.e. $N_2$ plasma, $NH_3$ and metallic Ga. Also in the case where other growth processes are used, such as MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors). Many of the prior art buffer schemes do not adequately protect the silicon substrate.

It would be highly advantageous, therefore, to remedy the foregoing and other deficiencies inherent in the prior art.

Accordingly, it is an object of the present invention to provide new and improved methods for the growth of III-N material on a silicon substrate.

It is another object of the present invention to provide new and improved methods for the growth of III-N material on a GaN/REO/silicon substrate structure that includes substantially reducing strain in the final III-N material.

It is another object of the present invention to provide new and improved methods for the growth of III-N material on a silicon substrate that includes eliminating or greatly reducing the problem of possible damage to the silicon substrate with process gasses.

It is another object of the present invention to provide new and improved III-N layers grown on a silicon substrate.

It is another object of the present invention to provide new and improved LED and/or HEMT structures formed on III-N layers on a silicon substrate.

SUMMARY OF THE INVENTION

Briefly, the desired objects and aspects of the instant invention are realized in accordance with a III-N material grown on a silicon substrate that includes a single crystal rare earth oxide layer positioned on the silicon substrate. The rare earth oxide is substantially crystal lattice matched to the surface of the silicon substrate. A first layer of III-N material is positioned on the surface of the rare earth oxide layer. An inter-layer of aluminum nitride (AlN) is positioned on the surface of the first layer of III-N material and an additional layer of III-N material is positioned on the surface of the inter-layer of aluminum nitride. The inter-layer of aluminum nitride and the additional layer of III-N material are repeated n-times to reduce or engineer strain in a final III-N layer. A cap layer of AlN positioned on the final III-N layer substantially reduces strain in III-N semiconductor materials positioned thereon and especially nitrides including aluminum.

The desired objects and aspects of the instant invention are further achieved in accordance with a preferred method of growing III-N material on a silicon substrate including a step of growing or depositing a single crystal layer of rare earth oxide on a silicon substrate. The rare earth oxide layer is substantially crystal lattice matched to the surface of the silicon substrate. The method further includes the steps of growing or depositing a first layer of III-N material on the surface of the rare earth oxide layer; growing or depositing an inter-layer of aluminum nitride (AlN) on the first layer of III-N material; and growing or depositing an additional layer of III-N material on the surface of the layer of aluminum nitride. The step of growing or depositing the inter-layer of aluminum nitride and the additional layer of III-N material are repeated n-times to reduce or engineer strain in a final III-N layer. A cap layer of AlN is positioned on the final III-N layer to facilitate the further growth of III-N semiconductor materials and especially nitrides including aluminum.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
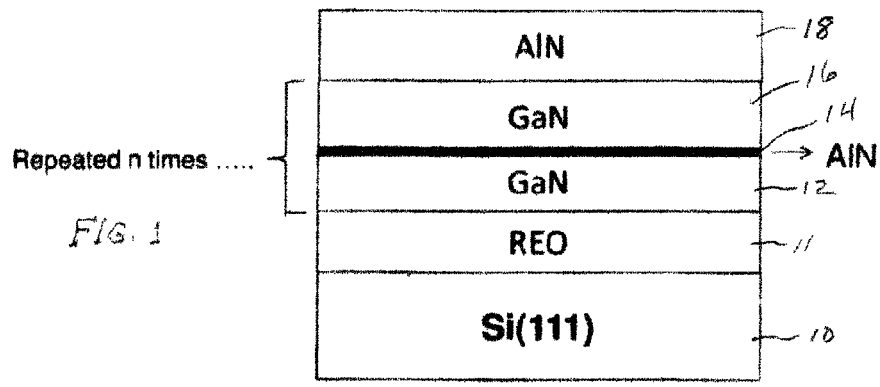
FIG. 1 is a simplified layer diagram illustrating a method of growing an AlN cap on a GaN/REO/silicon substrate structure, in accordance with the present invention.

Turning to FIG. 1, a simplified layer diagram is illustrated representing several steps in a process of growing III-N material and devices on a silicon substrate 10, in accordance with the present invention. It will be understood that substrate 10 is or may be a standard well known single crystal wafer or portion thereof generally known and used in the semiconductor industry. Single crystal substrates, it will be understood, are not limited to any specific crystal orientation but could include (111) silicon, (110) silicon, (100) silicon or any other orientation or variation known and used in the art. The Si (100) and (111) substrates could also include various miscuts with nominal value between 0 and 10° in any direction. However, throughout this disclosure substrate 10 is illustrated with a preferred (111) orientation because of the simplification of further operations.

A layer 11 of rare earth oxide (REO) is epitaxially grown on silicon substrate 10. Various rare earth oxides have a crystal lattice spacing that can be matched to silicon with very little strain. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. Further, the crystal lattice spacing of REO layer 11 can be varied by varying the composition of the constituents, which allows for strain engineering of the silicon wafers. Generally, the REO material closest to or adjacent silicon substrate 10 will have a crystal spacing closest to the crystal spacing of silicon while REO materials adjacent the opposite (upper) side of layer 11 will have a crystal spacing closer to the crystal spacing of materials grown on the surface. Strain engineering mitigates the stresses formed during growth of III-N materials and devices on these substrate structures.

In a typical example, layer 11 includes $Gd_2O_3$ epitaxially grown on silicon substrate 10 with $Er_2O_3$ epitaxially grown adjacent the opposite (upper) side. The REO materials can be grown in a graded fashion bridging the two compositions or split to have an abrupt change in the composition and/or constituents of layer 11. Also, while two constituents are used in this example other and/or additional rare earth oxides can be included in layer 11.

It should be noted that rare earth oxide is impervious to MBE process gasses, i.e. $N_2$ plasma, $NH_3$ and metallic Ga, which is the preferred growth process in this invention. Also, in the event that other growth processes are used, such as the MOCVD process, the rare earth oxide is also impervious to MOCVD process gasses ($NH_3$, $H_2$, TMGa, etc.). Reaction of silicon with process gasses usually results in etching of silicon ($H_2$), formation of nitrides ($NH_3$), or severe reaction and blistering (Ga precursors). Thus silicon substrate 10 is protected from damage caused by generally all growth process gasses by rare earth oxide layer 11. Also, rare earth oxide layer 11 can be formed with a single continuous composition or it can be graded, in linear, stepwise or any similar schemes.

A gallium nitride (GaN) layer 12 is epitaxially grown on rare earth oxide layer 11 preferably by an MBE process. Generally, GaN layer 12 will be in a range of 50 nm to 100 nm thick, although thicker or thinner layers can be grown. Because there will still be some strain in GaN layer 12, i.e. the crystal lattice junction with REO layer 11 still produces some strain, a thinner layer 12 of GaN is preferred.

A thin inter-layer of aluminum nitride (AlN) 14 is epitaxially grown on GaN layer 12 to further reduce the strain. Preferably, AlN inter-layer 14 is in a range of approximately 1 nm to approximately 10 nm thick but for certain applications thicker or thinner films can be grown. Also, AlN inter-layer 14 can be grown using either a low or a high temperature process. A second layer 16 of GaN is epitaxially grown on AlN inter-layer 14. A second inter-layer of AlN is grown on second GaN layer 16 and this process is repeated n times or until the strain in the upper GaN layer has been reduced to an acceptable level. Basically, the strain formed during the growth of the GaN is controlled by insertion of the thin inter-layers of AlN, each of which allows the following layer of GaN to be under compressive stress due to the pseudomorphic growth at the interface. Repeating the process (i.e. the alternating growth of layers 14 and 16) n times can be used to further reduce or engineer strain in the final GaN or III-N layer. Also, it should be noted that since each additional layer of GaN grown on the next inter-layer of AlN has less strain, each additional layer can be grown thicker if desired.

Even with multiple Interlayers of AlN and GaN grown on REO layer 11 there can be some strain when a III-N layer of material is grown on the upper surface. Thus, to facilitate the growth of III material nitrides (III-N) an AlN cap layer 18 is epitaxially grown on the GaN/REO/silicon substrate structure. AlN cap layer 18 provides a better match between the GaN/REO/silicon substrate structure and substantially removes any strain that may remain between III material nitrides, especially any nitrides including aluminum. It has been determined, for example, that III-N materials used in various semiconductor devices have some specific advantages if aluminum is included as at least one of the constituents. Thus, AlN cap layer 18 facilitates the growth of III-N materials and especially III-N materials including aluminum. Also, in some applications AlN cap layer 18 reduces the number of times that the alternating growth of layers 14 and 16 need to be repeated in order to reduce the strain in the final III-N layer.

Figure 2:
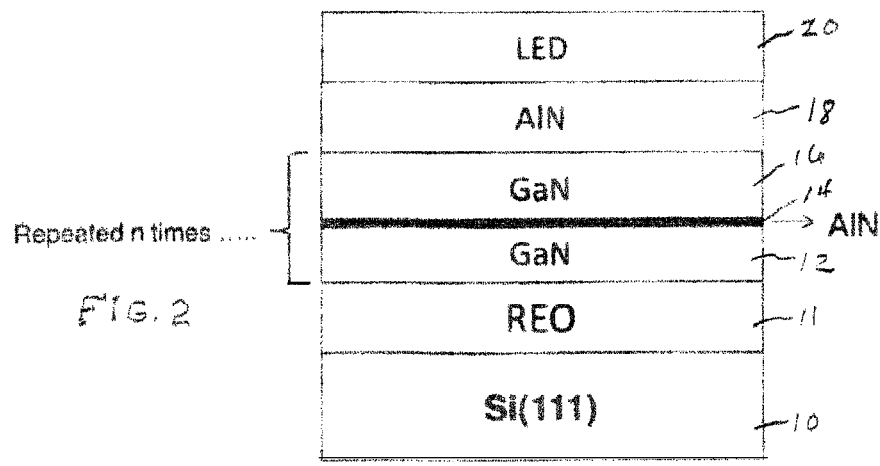
FIG. 2 is a simplified layer diagram of the silicon substrate structure of FIG. 1 with an LED device formed thereon.

Turning to FIG. 2, AlN cap layer 18 is illustrated with a III-N LED structure 20 formed thereon. Structure 20 is illustrated as a single layer for convenience but it should be understood that III-N LED structure 20 includes the growth of one or more typical layers, including for example, i-GaN, n-GaN, active layers such as InGaN/GaN, electron blocking layers, p-GaN, and other inter-layers used in the formation and performance of LED (especially photonic LED) devices.

Figure 3:
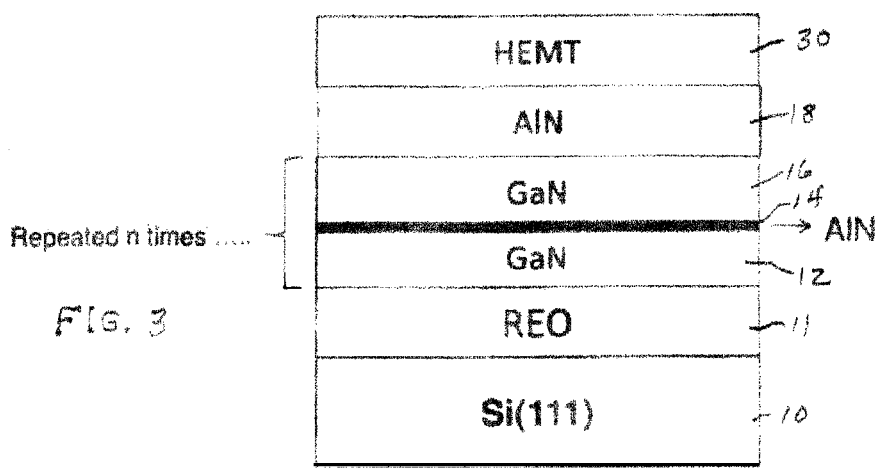
FIG. 3 is a simplified layer diagram of the silicon substrate structure of FIG. 1 with an HEMT device formed thereon.

Turning to FIG. 3, AlN cap layer 18 is illustrated with a HEMT structure 30 formed thereon. Structure 30 is illustrated as a single layer for convenience but it should be understood that HEMT structure 30 includes the growth of one or more typical layers, including for example, i-GaN, AlN, AlGaN, GaN, and other inter-layers used in the formation and performance of HEMT devices.

Thus, new and improved methods for the growth of III-N material and devices on a silicon substrate are disclosed. The new and improved methods for the III-N material include the growth of a substantially crystal lattice matching REO layer on the silicon substrate, n repetitions of the growth of thin AlN inter-layers in the GaN material, and a AlN cap layer to further reduce or engineer the strain. Also, the REO layer eliminates or greatly reduces the problem of possibly damaging the silicon substrate with process gasses. New and improved LED and/or HEMT structures can be substantially lattice matched and thermally matched by the new process on a silicon substrate.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. III-N material grown on a silicon substrate comprising:
a single crystal silicon substrate;
a single crystal rare earth oxide layer positioned on the silicon substrate, the rare earth oxide being substantially crystal lattice matched to the surface of the silicon substrate;
a first layer of single crystal GaN material positioned on the surface of the single crystal rare earth oxide layer;
an inter-layer of single crystal aluminum nitride (AlN) positioned on the surface of the first layer of single crystal GaN material and an additional layer of single crystal GaN material positioned on the surface of the inter-layer of single crystal aluminum nitride, the inter-layer of single crystal aluminum nitride and the additional layer of single crystal GaN material repeated n-times to reduce or engineer strain in a final single crystal GaN layer; and
a cap layer of single crystal AlN positioned on the surface of the final single crystal GaN layer.

2. The III-N material grown on a silicon substrate as claimed in claim 1 wherein the single crystal layer of rare earth oxide includes a composition including multiple rare earth oxides one of graded to bridge the multiple rare earth oxides or stepped to have an abrupt change in the rare earth oxides.

3. The III-N material grown on a silicon substrate as claimed in claim 2 wherein the composition including multiple rare earth oxides includes a first single crystal rare earth oxide adjacent the single crystal silicon substrate having a crystal lattice spacing substantially matching a double lattice spacing of silicon and a second single crystal rare earth oxide adjacent the first layer of single crystal GaN material having a crystal lattice spacing substantially matching a crystal lattice spacing of the single crystal GaN material.

4. The III-N material grown on a silicon substrate as claimed in claim 1 further including a layer of single crystal III-N material grown on the cap layer and including one of an LED structure and an HEMT structure.

5. The III-N material grown on a silicon substrate as claimed in claim 4 wherein the LED structure includes at least one layer of i-GaN, n-GaN, an active layer, an electron blocking layer, or p-GaN.

6. The III-N material grown on a silicon substrate as claimed in claim 4 wherein the HEMT structure includes at least one layer of i-GaN, AlN, AlGaN, or GaN.

7. A method of growing III-N material on a silicon substrate comprising the steps of:
providing a single crystal silicon substrate;
growing or depositing a single crystal layer of rare earth oxide on the silicon substrate, the rare earth oxide layer being substantially crystal lattice matched to the surface of the silicon substrate;
growing or depositing a first layer of single crystal GaN on the surface of the rare earth oxide layer;
growing or depositing an inter-layer of single crystal aluminum nitride (AlN) on the first layer of GaN;
growing or depositing an additional layer of single crystal GaN on the surface of the layer of aluminum nitride;
repeating the steps of growing or depositing the inter-layer of aluminum nitride and the additional layer of GaN material n-times to reduce or engineer strain in a final GaN layer; and
growing or depositing a cap layer of single crystal AlN on the surface of the final GaN layer.

8. The method as claimed in claim 7 wherein the step of growing or depositing the single crystal layer of rare earth oxide includes a growing or depositing a composition including multiple rare earth oxides one of graded to bridge the multiple rare earth oxides or stepped to have an abrupt change in the rare earth oxides.

9. The method as claimed in claim 8 wherein the step of growing or depositing the composition includes growing or depositing a first rare earth oxide adjacent the silicon substrate having a crystal lattice spacing substantially matching a double lattice spacing of silicon and a second rare earth oxide adjacent the first layer of single crystal GaN having a crystal lattice spacing substantially matching a crystal lattice spacing of the first layer of single crystal GaN.

10. The method as claimed in claim 7 wherein the step of growing or depositing the inter-layer of aluminum nitride includes depositing a layer in a range of approximately 1 nm to approximately 10 nm thick.

11. The method as claimed in claim 7 wherein the step of growing the AlN cap layer on the surface of the final GaN layer further includes growing or depositing an LED structure on the AlN cap layer.

12. The method as claimed in claim 11 wherein the step of growing the AlN cap layer on the final GaN layer includes growing at least one layer including one of i-GaN, n-GaN, active layers, electron blocking layers, or p-GaN.

13. The method as claimed in claim 7 wherein the step of growing or depositing the cap layer of AlN, includes growing or depositing an HEMT structure on the AlN cap layer.

14. The method as claimed in claim 13 wherein the step of growing the HEMT structure on the final layer of GaN material includes growing at least one layer including one of i-GaN, AlN, AlGaN, or GaN.

15. A method of growing III-N material on a silicon substrate comprising the steps of:
providing a single crystal silicon substrate;
epitaxially depositing a single crystal layer of rare earth oxide on the silicon substrate, the rare earth oxide layer being substantially crystal lattice matched to the surface of the silicon substrate;
epitaxially depositing a first layer of single crystal GaN on the surface of the rare earth oxide layer;
epitaxially depositing an inter-layer of single crystal aluminum nitride (AlN) on the first GaN layer;
epitaxially depositing an additional layer of single crystal GaN on the surface of the aluminum nitride inter-layer;
repeating the steps of epitaxially depositing the inter-layer of single crystal aluminum nitride and the additional layer of single crystal GaN material n-times to reduce or engineer strain in each subsequent additional layer of single crystal GaN material and in a final single crystal GaN layer; and
epitaxially growing or depositing a cap layer of single crystal AlN on the surface of the final single crystal GaN layer, the single crystal AlN cap layer further including growing or depositing one of an LED structure and an HEMT structure.

* * * * *